(12) United States Patent
Rahman et al.

(10) Patent No.: US 11,442,366 B2
(45) Date of Patent: Sep. 13, 2022

(54) DEVICE MANUFACTURING METHODS

(71) Applicant: ASML NETHERLANDS B.V., Veldhoven (NL)

(72) Inventors: Rizvi Rahman, Eindhoven (NL); Hakki Ergün Cekli, Eindhoven (NL); Cëdric Dësirë Grouwstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 92 days.

(21) Appl. No.: 16/620,899

(22) PCT Filed: May 7, 2018

(86) PCT No.: PCT/EP2018/061696
§ 371 (c)(1),
(2) Date: Dec. 10, 2019

(87) PCT Pub. No.: WO2018/228750
PCT Pub. Date: Dec. 20, 2018

(65) Prior Publication Data
US 2020/0201191 A1  Jun. 25, 2020

(30) Foreign Application Priority Data

Jun. 14, 2017  (EP) .................................. 17175967

(51) Int. Cl.
*G05B 19/418* (2006.01)
*H01L 21/66* (2006.01)
*G03F 7/20* (2006.01)

(52) U.S. Cl.
CPC ... *G03F 7/70191* (2013.01); *G05B 19/41875* (2013.01); *H01L 22/20* (2013.01); *G05B 2219/45028* (2013.01)

(58) Field of Classification Search
CPC .... G03F 7/70191; G03F 7/00; G03F 7/70525; G03F 7/705; G03F 7/70616;
(Continued)

(56) References Cited

U.S. PATENT DOCUMENTS

2005/0095515 A1* 5/2005 Pellegrini ........... G03F 7/70633
430/30
2005/0187649 A1* 8/2005 Funk .................. G05B 19/4184
700/121

(Continued)

FOREIGN PATENT DOCUMENTS

CN        1841211      10/2006
CN       101059658     10/2007
(Continued)

OTHER PUBLICATIONS

Chinese Office Action issued in corresponding Chinese Patent Application No. 201880040055.1, dated Mar. 16, 2021.
(Continued)

*Primary Examiner* — Thomas C Lee
*Assistant Examiner* — Charles Cai
(74) *Attorney, Agent, or Firm* — Pillsbury Winthrop Shaw Pittman LLP

(57) ABSTRACT

A device manufacturing method, the method including: obtaining a measurement data time series of a plurality of substrates on which an exposure step and a process step have been performed; obtaining a status data time series relating to conditions prevailing when the process step was performed on at least some of the plurality of substrates; applying a filter to the measurement data time series and the status data time series to obtain filtered data; and determining, using the filtered data, a correction to be applied in an exposure step performed on a subsequent substrate.

20 Claims, 8 Drawing Sheets

(58) Field of Classification Search
CPC .... G05B 19/41875; G05B 2219/45028; H01L 22/20; H01L 22/12; Y02P 90/02
See application file for complete search history.

(56) References Cited

U.S. PATENT DOCUMENTS

| | | | | |
|---|---|---|---|---|
| 2006/0184336 | A1* | 8/2006 | Kolen | A63B 60/42 |
| | | | | 702/150 |
| 2006/0221322 | A1 | 10/2006 | Tinnemans et al. | |
| 2007/0250187 | A1 | 10/2007 | Heertjes | |
| 2009/0244767 | A1* | 10/2009 | Heertjes | G06F 19/00 |
| | | | | 360/77.02 |
| 2010/0161099 | A1 | 6/2010 | Mos et al. | |
| 2012/0008127 | A1 | 1/2012 | Tel et al. | |
| 2013/0115723 | A1* | 5/2013 | Ishida | B82Y 10/00 |
| | | | | 438/17 |
| 2013/0204418 | A1* | 8/2013 | Chang | G05B 19/41875 |
| | | | | 700/97 |
| 2014/0089870 | A1 | 3/2014 | Mos et al. | |
| 2014/0270470 | A1* | 9/2014 | Schwartzband | G06T 5/003 |
| | | | | 382/145 |

FOREIGN PATENT DOCUMENTS

| | | |
|---|---|---|
| CN | 101762988 | 6/2010 |
| CN | 103744267 | 4/2014 |

OTHER PUBLICATIONS

International Search Report and Written Opinion issued in corresponding PCT Patent Application No. PCT/EP2018/061696, dated Sep. 17, 2018.

Crow et al: "Enhancement of photolithographic performance by implementing an advanced process control system", Proc. of SPIE, vol. 5378, Apr. 29, 2004.

Verstappen et al: "Holistic overlay control for multi-patterning process layers at the 10nm and 7nm nodes", Proceedings of SPIE, vol. 9778, Mar. 24, 2016.

Van Der Laan et al: "Etch, reticle, and track CD fingerprint corrections with local dose compensation", Proc. of SPIE, vol. 5755, May 17, 2005.

Korean Office Action issued in corresponding Korean Patent Application No. 10-2019-7037173, dated Mar. 30, 2022.

* cited by examiner

APC Correction

APC Correction

27
DEVICE MANUFACTURING METHODS

CROSS-REFERENCE TO RELATED APPLICATIONS

This application is the U.S. national phase entry of PCT Patent Application No. PCT/EP2018/061696, filed on May 7, 2018, which claims the benefit of priority of European Patent Application No. 17175967.3 which was filed on Jun. 14, 2017 and which is incorporated herein in its entirety by reference.

BACKGROUND

Field of the Invention

The present invention relates to device manufacturing using lithographic apparatus and process apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. The patterned radiation-sensitive layer is then developed and a process apparatus, such as an etcher, is used to fix the pattern in the substrate.

To create an electronic device, it is necessary to repeat the exposure and fixing steps many times, e.g. up to 30, to create the different layers of a device. Each layer is applied to a batch, also known as a lot, of substrates at a time. To improve yield, i.e. the fraction of devices that are functional, it is known to use measurements performed on substrates to adjust the exposures of subsequent substrates in the same batch or later batches to which the same process is applied, for example to reduce errors in overlay, focus or CD. This process is know as Automated Process Control. Where measurements of multiple substrates are available, a weighted moving average of the measurements is often used as the input to the process control.

However, known APC methods still leave a "fingerprint"—that is a variation of a parameter such as focus, overlay or CD—across the substrate and there is therefore a need for improvement in automated process control methods.

SUMMARY OF THE INVENTION

The present invention aims to provide improved automated process control methods for use in lithographic manufacturing processes.

The invention in a first aspect provides a device manufacturing method, the method comprising:

obtaining a measurement data time series of a plurality of substrates on which an exposure step and a process step have been performed;

obtaining a status data time series relating to conditions prevailing when the process step was performed on at least some of the plurality of substrates;

applying a filter to the measurement data time series and the status data time series to obtain filtered data; and determining, using the filtered data, a correction to be applied in an exposure step performed on a subsequent substrate.

The invention in a second aspect provides a device manufacturing method, the method comprising:

obtaining a measurement data time series of a plurality of substrates on which an exposure step and a process step have been performed;

applying a filter to the measurement data time series to obtain filtered data;

determining, using the filtered data, a correction to be applied in an exposure step performed on a subsequent substrate applying a further filter to the measurement data time series to obtain further filtered data; and determining, using the further filtered data, a further correction to be applied in the exposure step performed on the subsequent substrate.

The invention in a third aspect provides a device manufacturing method, the method comprising:

obtaining a measurement data time series of a plurality of substrates on which an exposure step and a process step have been performed;

obtaining a status data time series relating to conditions prevailing when the process step was performed on at least some of the plurality of substrates;

transforming the measurement data time series and the status data time series into frequency space data;

determining, on the basis of the frequency space data, a filter to be applied to at least one of the measurement data time series and the status data time series to obtain filtered data;

applying the filter to the at least one of the measurement data time series and the status data time series to obtain filtered data; and determining, using the filtered data, a correction to be applied in an exposure step performed on a subsequent substrate.

The invention in a fourth aspect provides a device manufacturing method, the method comprising:

obtaining a measurement data time series of a plurality of substrates on which an exposure step and a process step have been performed;

obtaining a status data time series relating to conditions prevailing when the process step was performed on at least some of the plurality of substrates;

transforming the measurement data time series and the status data time series into frequency space data; and determining on the basis of the frequency space data, a sampling scheme to be applied to subsequent substrates to generate a measurement data time series.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
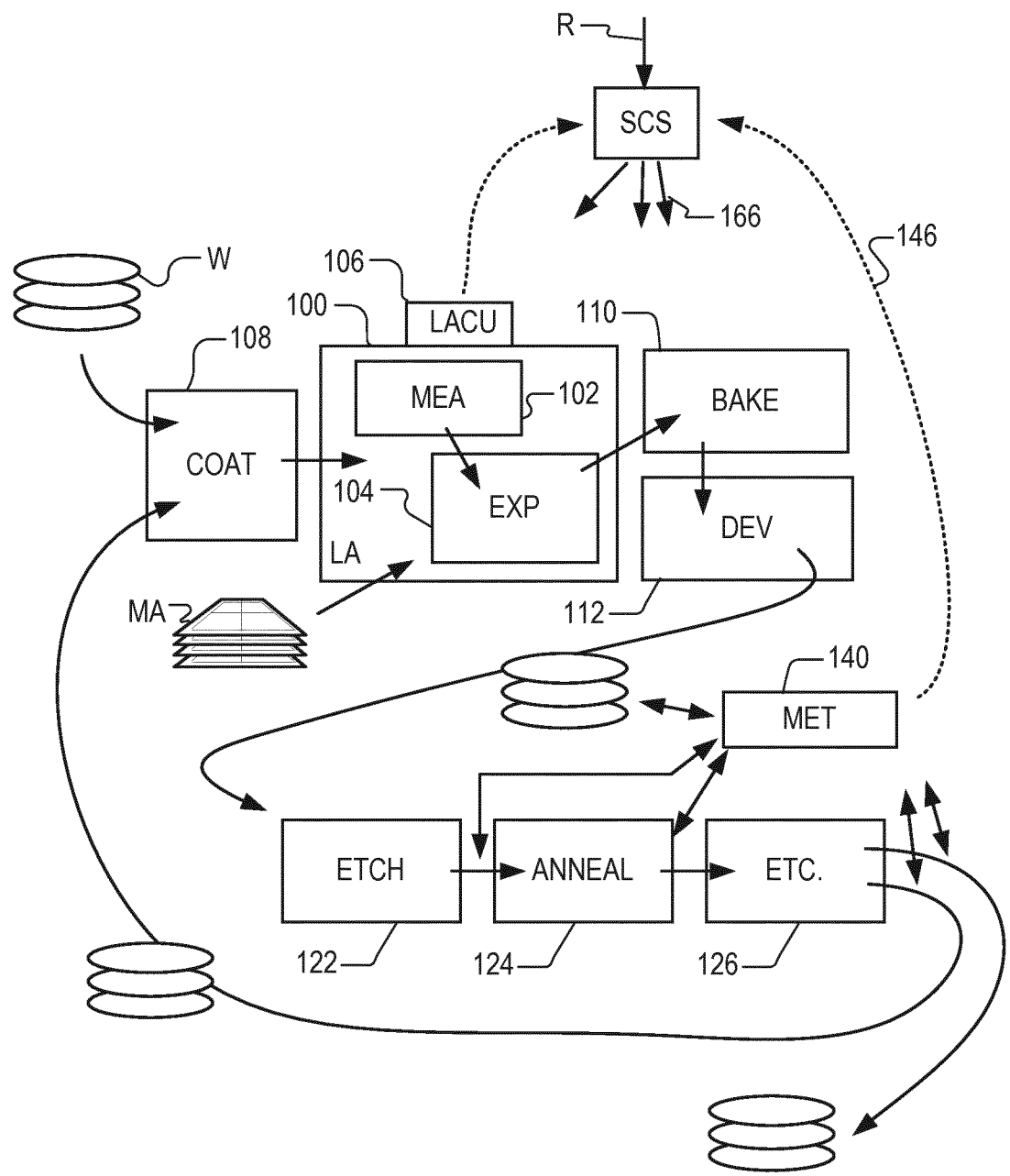
FIG. 1 depicts a lithographic apparatus together with other apparatuses forming a production facility for semiconductor devices.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal position errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. . . . . The metrology apparatus is configured to inspect substrates after development (112) or after further processing (e.g. etching). The various apparatus within the litho cell are controlled by a supervisory control system SCS, which issues control signals 166 to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as automated process control (APC) described for example in US2012008127A1. The automated process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to generate corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

Automated process control often aims to control, e.g. reduce, lot to lot variations in substrate fingerprints in process parameters such as overlay, focus, CD. A "fingerprint" is the variation of a parameter (or error in a parameter) over area. An intrafield fingerprint is the variation across a field and in some cases will be the same for all the fields on a substrate. A substrate fingerprint is the variation across the whole substrate. In some cases, a substrate fingerprint can be separated into an intrafield fingerprint and a interfield fingerprint. The present invention concerns all types of fingerprints.

Figure 2:
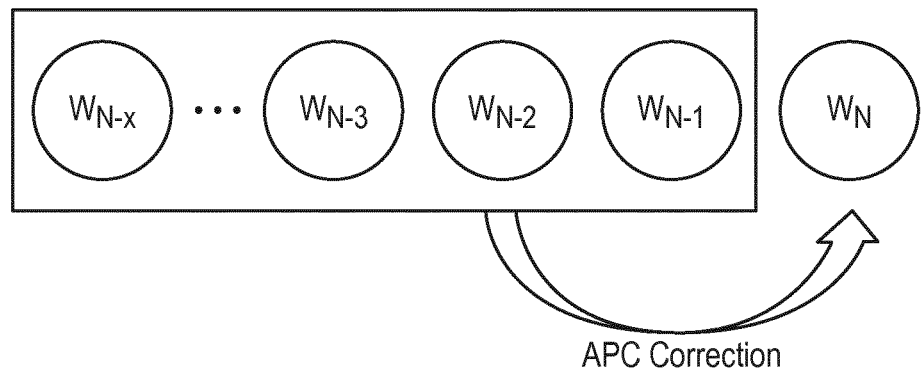
FIG. 2 depicts a conventional automated process control method.

As depicted in FIG. 2, a conventional APC correction in high volume manufacturing (HVM) conditions is based on feedback. Measurements obtained from a plurality of preceding substrates $W_{N-1}$ to $W_{N-x}$ are used to control one or more process parameters of a current substrate $W_N$. The measurements, or correction parameters derived from individual measurements, are grouped together and fed into a moving average (MA), for example an exponentially weighted moving average (EWMA).

In more sophisticated cases, a certain MA is applied for interfield and intrafield corrections and another type of MA for high-order (such as correction per field) corrections. In even more sophisticated cases, certain layers get fed some of the corrections determined on a previous layer if the two layers are expected to display very similar fingerprints. However, even these schemes have several drawbacks.

Firstly, limited time filtering algorithms are used. The inventors have determined that a moving average may not enable the time-variation of a parameter to be accurately captured.

Secondly, often unnecessary metrology steps are performed. In some cases, high order fingerprints (for example intrafield fingerprints) vary more slowly than interfield fingerprints. For example, the stability periods of an etcher (giving rise to an interfield fingerprint) and the projection system of a lithography apparatus (giving rise to an intrafield fingerprint) could be very different and therefore the corresponding fingerprints' time variation differences will be different. Therefore, by measuring all lots with the same sampling designed to correct all substrate and intrafield fingerprints, time is spent that could be used for other purposes.

Thirdly, existing automated process control methods do not make use of information from substrate processing tools. The inventors have determined that the root cause of the time variation of certain modeled parameters can be linked to process tools. For example, time variation in wafer scaling might be linked to stability of an etcher, characterized by some of its sensor data's time variation. In those cases, collecting the readily available etcher tool sensor data is much easier and cheaper than measuring more lots and/or wafers with metrology tools to fine tune the time filters.

Figure 3:
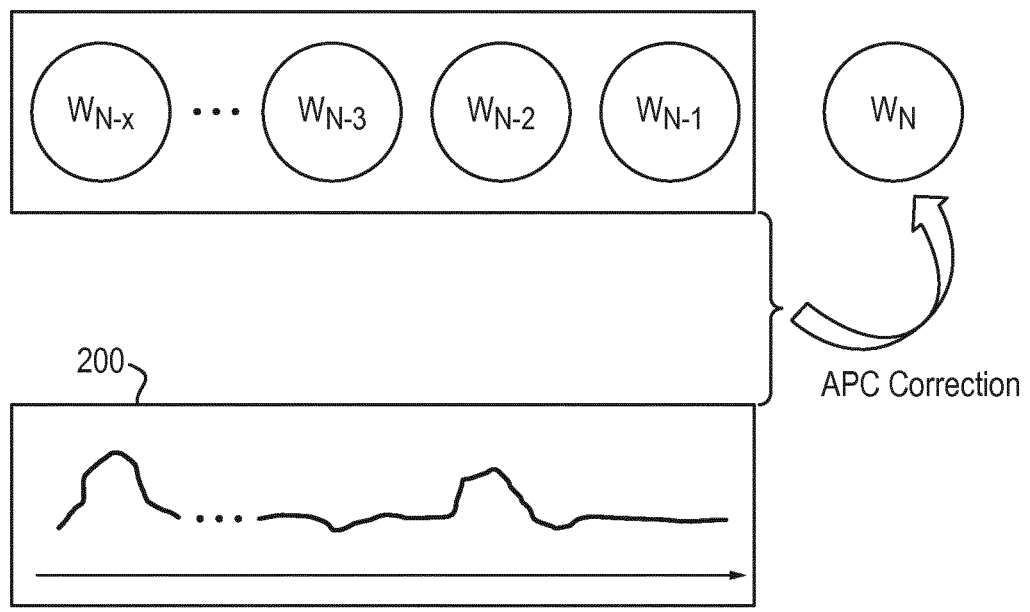
FIG. 3 depicts a principle of operation of an automated process control method according to an embodiment of the invention.

Therefore, embodiments of the present invention allow these drawbacks to be alleviated and provide means to fine tune APC feedback loops for reduced lot to lot variation in process parameters and/or allow a decreased metrology sampling rate and/or density. An embodiment is depicted in FIG. 3, which shows metrology measurements obtained from a plurality of preceding substrates $W_{N-1}$ to $W_{N-x}$ used together with status data 200 to control one or more process parameters of a current substrate $W_N$. Status data 200 relates to conditions pertaining in one ore more process tools, such as an etcher or annealer, when relevant layers on substrates $W_{N-1}$ to $W_{N-x}$ were processed by those tools.

In an embodiment of the invention, the information derived from metrology measurements can be provided in the format of a data time series, that is a series of data values each associated with a time. It should be noted that the time associated with a data value is not necessarily the time at which the measurement was made but rather the time at which a relevant manufacturing step, e.g. an exposure, was performed on the structure or target measured. The aim of the metrology steps and of providing the metrology data as a time series is to infer time variation in conditions prevailing in a manufacturing tool, e.g. a lithographic apparatus. The information derived from metrology measurements can be the actual measurement results themselves or modelled parameters—such as translation, rotation, scaling, etc.—derived from the actual measurement results.

Status data relating to conditions prevailing in a manufacturing tool can also be presented in a time series for the same purpose. Status data may comprise control values applied to a manufacturing tool or measurements of conditions prevailing in the manufacturing tool. In the latter case, the time associated with a status data value may be the time at which the measurement was made.

In an embodiment of the invention, an automated process control system applies time filters independently to different controllable process parameters. In the simplest embodiment, a user can decide which filter to apply to each data time series for each controllable process parameter. A library of smoothing filters is provided from which the user can select, for example:

Bessel filters
Butterworth filters
Matched filters
Elliptical filters (Cauer filters)
Linkwitz-Riley filters
Chebyshev filters
Biquad filters
High-pass filters
Low-pass filters
Band-pass filters
Infinite impulse response filters
Finite impulse response filters
Bilinear transforms
Kalman filters
Savitzky-Golay filters It is also possible to use multiple filters in series or in parallel to filter inputs for a single controllable process parameter. In an embodiments, a first filter is applied to measurement data of the measurement data time series relating to a first zone of the substrates and a second filter, different from the first filter, is applied to measurement data of the measurement data time series relating to a second zone of the substrates. For example, measurement data relating to edge dies can be treated differently than measurement date relating to interior dies.

Figure 4:
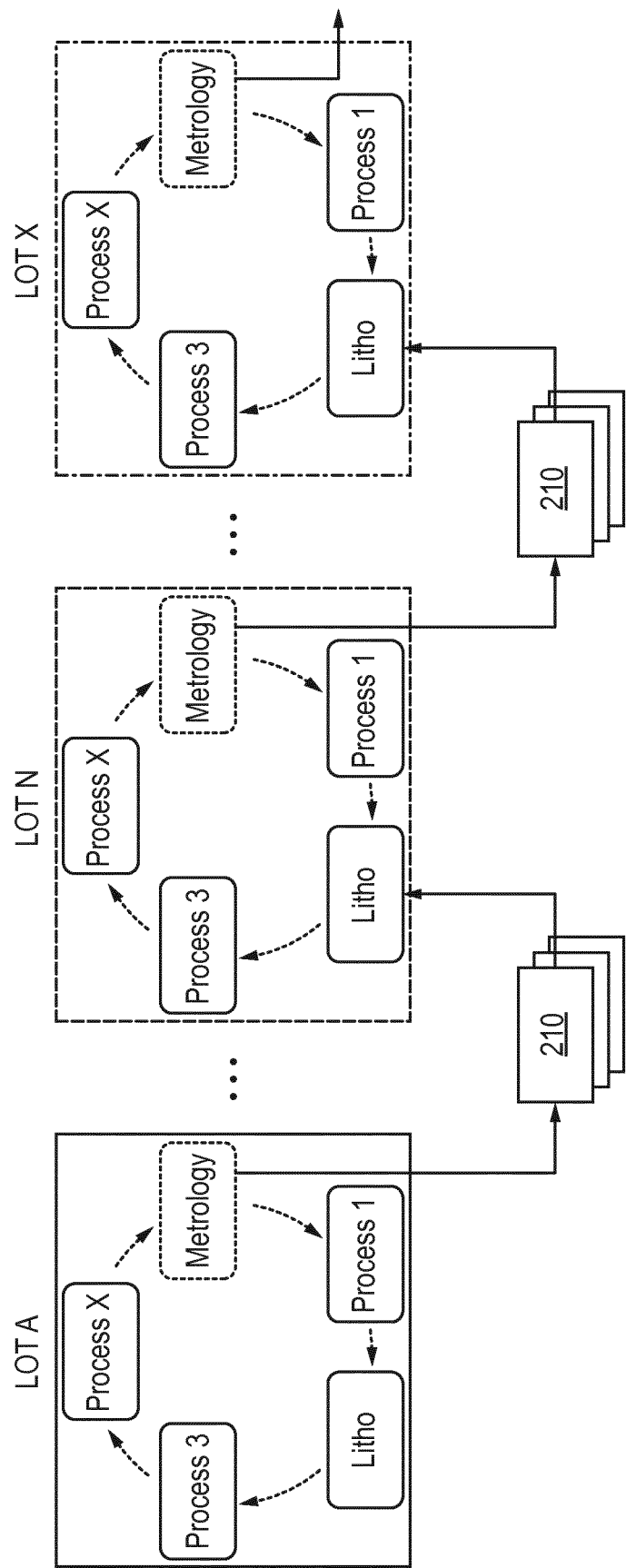
FIG. 4 depicts a specific application of an automated process control method according to an embodiment of the invention.

FIG. 4 depicts another embodiment of the invention in which a plurality of lots A . . . N . . . X are processed using the same recipe, each lot comprising a plurality of substrates. Metrology measurements are performed on the substrates of one or more lots, e.g. Lot A to Lot M, after a lithography step and one or more process steps. The metrology measurements from some or all of Lots A to M are used to calculate corrections to be applied to a subsequent Lot N using a mathematical model comprising a plurality of terms, e.g. a polynomial. Each term of the polynomial is calculated from the metrology measurements from some or all of Lots A to M using a respective time filter 210. The polynomial may have terms in powers of coordinates (e.g. x, y) representing position on the substrate. The time filters may be different for each term of the polynomial. Metrology measurements are performed on the substrates of Lot N, corresponding to those performed on some or all of Lots A to M. It is possible to refine the model as more information is available. The refined model is used to determine corrections for a subsequent Lot X, and so on.

Figure 5:
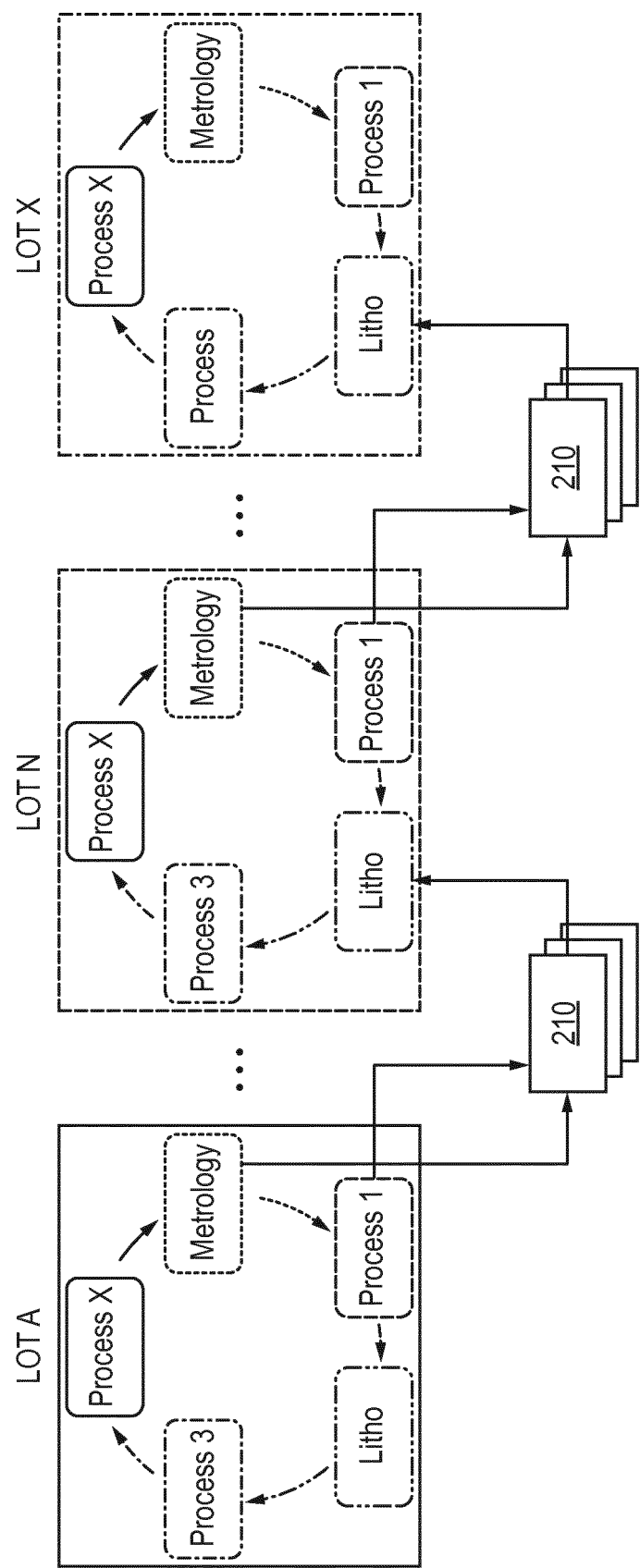
FIG. 5 depicts a specific application of an automated process control method according to an embodiment of the invention.

FIG. 5 depicts another embodiment of the invention which is similar to that of FIG. 4, except as described below. In the embodiment of FIG. 5, the status data from one or more process steps is used to fine tune the filters 210 which are applied to the metrology data.

Figure 6:
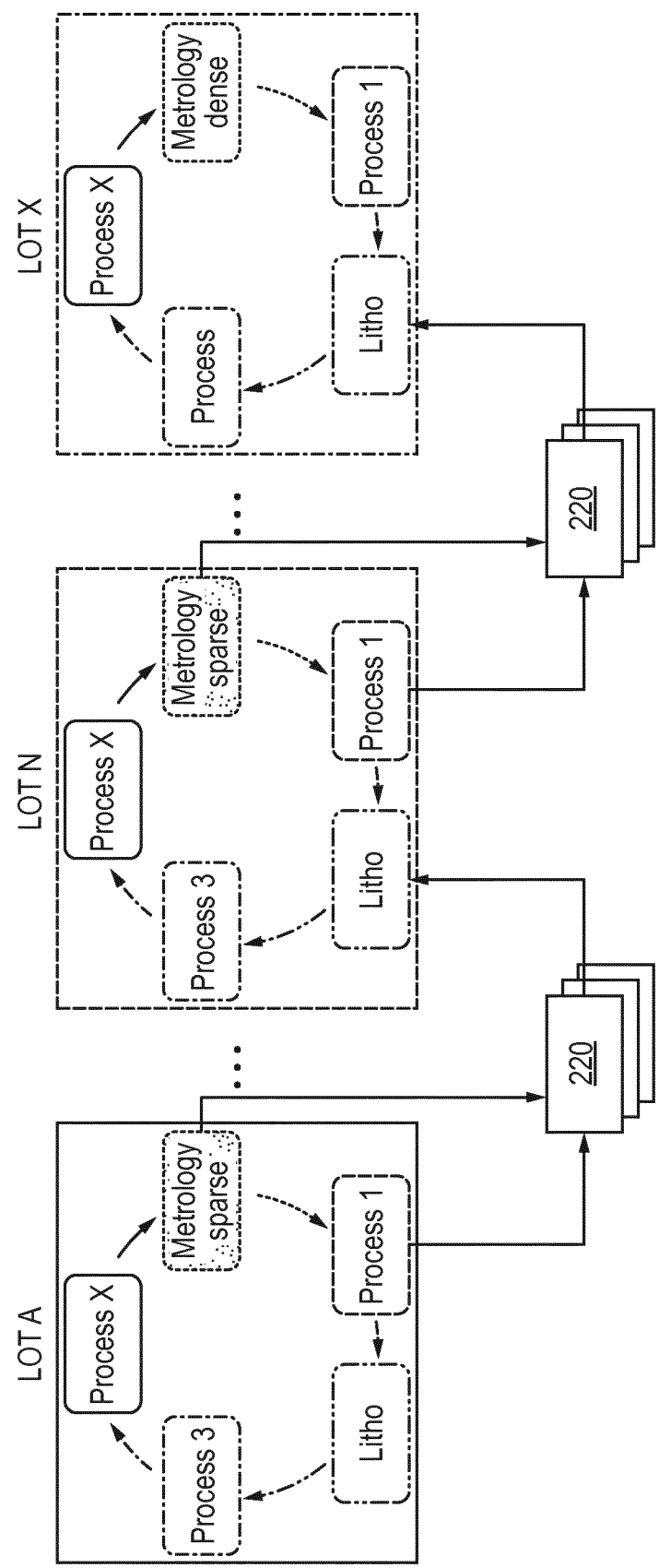
FIG. 6 depicts a specific application of an automated process control method according to an embodiment of the invention.

FIG. 6 depicts another embodiment of the invention which is similar to that of FIG. 4, except as described below. In the embodiment of FIG. 6, the status data from one or more process steps is used primarily to determine corrections to be applied in the subsequent lots, with appropriate time filters 220 being applied to the status data. Metrology measurements are used for verification and protection from excursions. Therefore, it is only necessary to perform a reduced number of metrology measurements, compared to the case where metrology is used as the primary determinant of the corrections to be applied in the subsequent lots. The number of metrology measurements performed per substrate need not be constant. This saves time and can therefore improve throughput.

Figure 7:
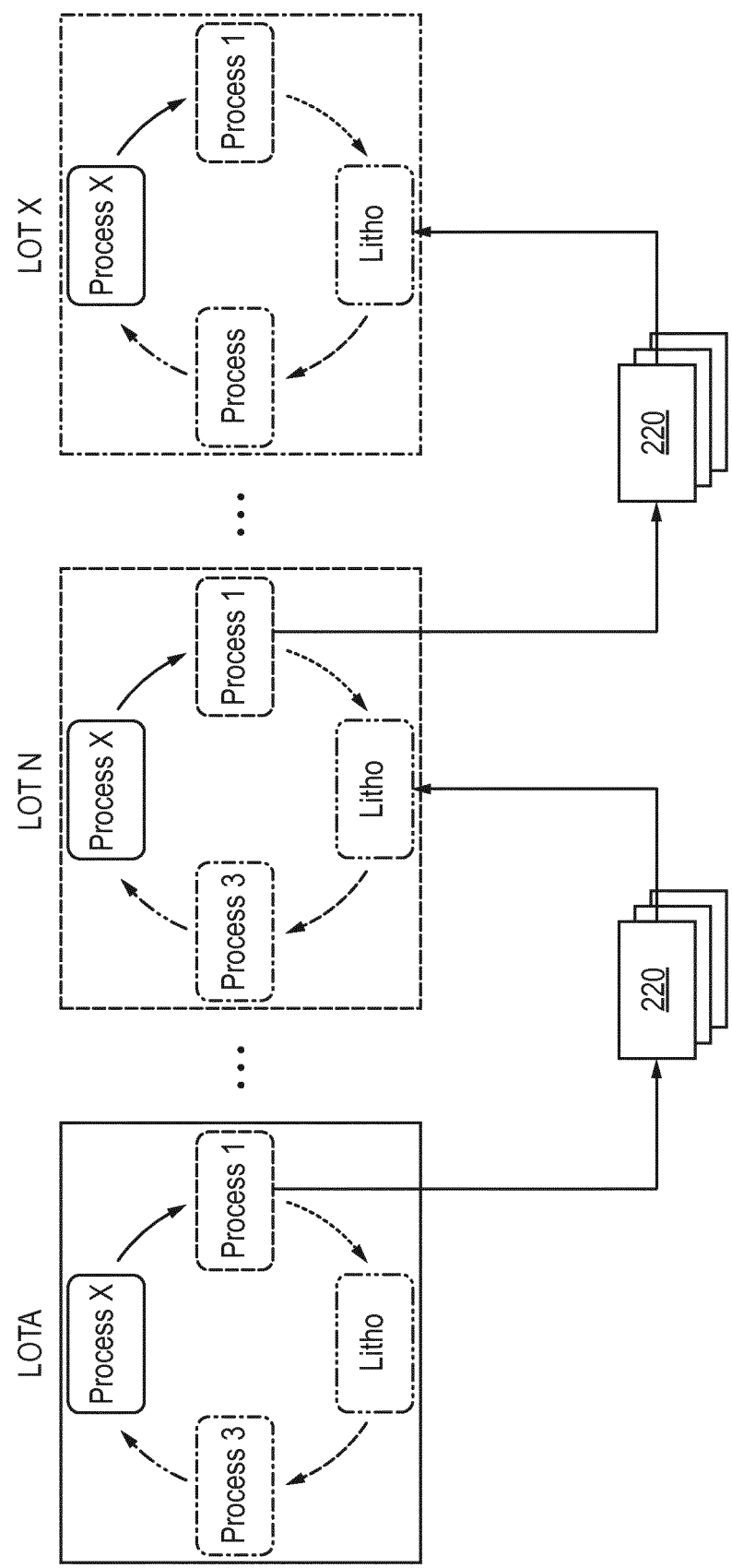
FIG. 7 depicts a specific application of an automated process control method according to an embodiment of the invention.

FIG. 7 depicts an embodiment in which only status data is filtered by filters 220 and used to determine corrections for subsequent lots. Metrology data is not used and so metrology steps can be omitted. This approach is particularly useful in a ramp-up phase prior to high volume manufacturing in which test substrates can be cycled through process steps.

Figure 8:
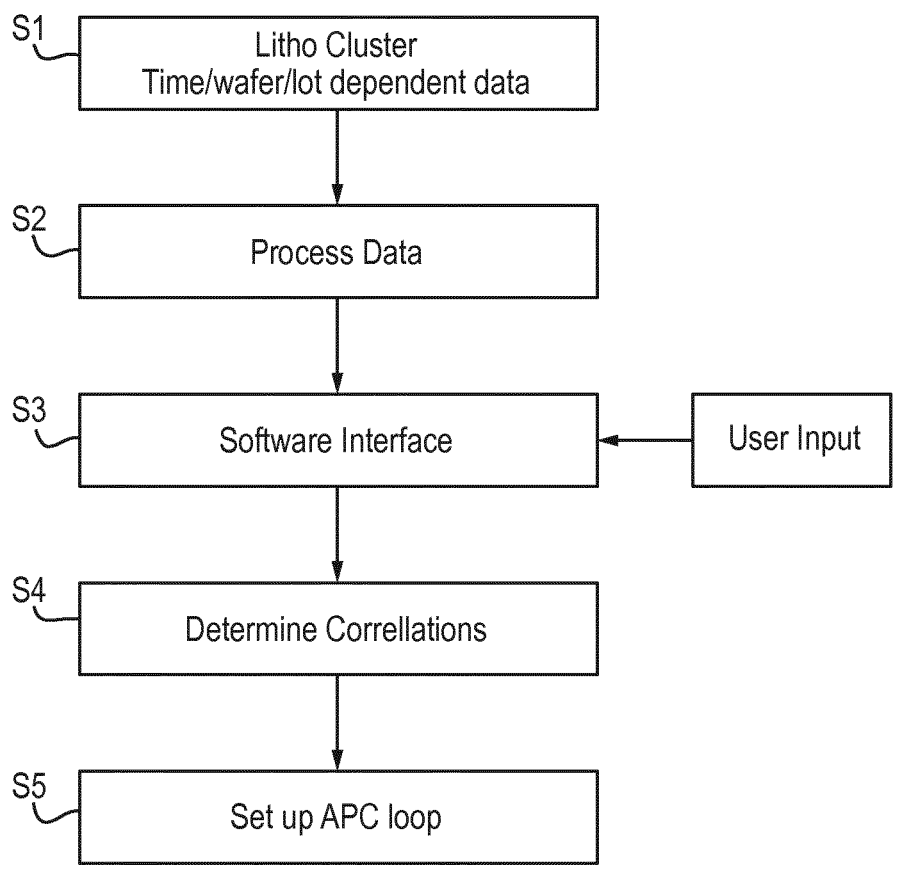
FIG. 8 depicts a process for setting up an automated process control method according to an embodiment of the invention.

FIG. 8 depicts a process according to another embodiment of the invention for enabling a user to set up appropriate filters for an APC loop. In step S1, initial data is obtained from the litho cluster. The initial data may comprise metrology data and/or status data from one or more substrates of one or more lots. The initial data may also be referred to as training data. In step S2, the initial data is processed to enable the time variation of sub-processes of the overall manufacturing process to be determined. In an embodiment, this can be done by determining the power spectrum density (PSD), or similar graph, using a Fourier transform or other similar transformations. Such a transformation converts the initial data from time series data into frequency space data. The frequency space data is used to find the optimal time filter to use per process parameter for the APC modeled parameter data flow. In an embodiment, the optimal time filters can be determined algorithmically. Alternatively, a software interface is presented in step S3 to receive user input to select filters.

Figure 9:
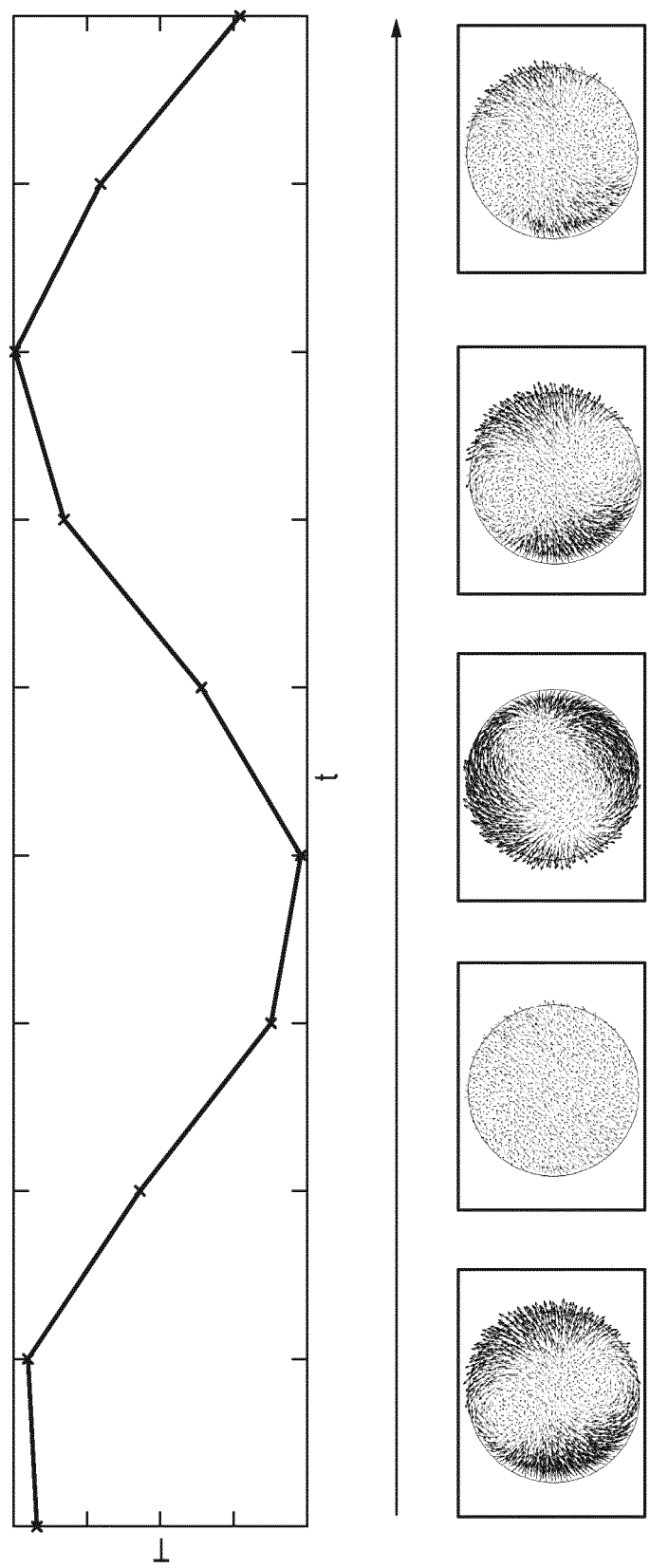
FIG. 9 depicts a simulated example of the effect of a process parameter on a substrate fingerprint.

One approach to select appropriate filters is to determine correlations S4, between specific process tool parameters and APC model parameters. Correlations can be determined using spectra of power or energy density, or correlation coefficient matrices or similar in order to accurately pair up process tool parameter(s) with metrology-based parameters(s) based on shared time dependency. As shown in FIG. 9, it may be that a correlation can be observed between temperature T (shown at top) in a process tool, e.g. an annealing furnace, and an overlay fingerprint (shown at bottom) as measured by the metrology tool. Such correlations can be presented to the user and enable the user to choose which process tool and which APC parameter to pair up for shared time dependency.

An embodiment of the invention can also advise and/or rank optimal time filters on the parameters of choice for optimal feedback control and can advise which process tool parameter to pair up with for additional fine tuning.

An embodiment of the invention can also propose a time and wafer layout scheme for metrology sampling. For example it might be desirable to measure a larger number of substrates at a small number of points for interfield fingerprint correction only and measure a smaller number of substrates or lots with a dense measurement scheme for intrafield correction.

Thus, desirable features of the invention are:
  it can determine APC filter settings specifically for the process steps involved
  it allows finding and linking relevant process tool sensor data to the APC model parameters for fine-tuned control
  it can do this independently per APC parameter
  it provides metrology sampling advice based on the aforementioned processes.

Examples of process parameters to which the present invention can be applied include: overlay, CD, CDU, sidewall angle, line edge roughness and focus. Markers and measurement techniques suitable for measuring these parameters are well known in the art.

While specific embodiments of the invention have been described above, it will be appreciated that the invention may be practiced otherwise than as described.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Embodiments are provided according to the following clauses:

1. A device manufacturing method, the method comprising:
  obtaining a measurement data time series of a plurality of substrates on which an exposure step and a process step have been performed;
  obtaining a status data time series relating to conditions prevailing when the process step was performed on at least some of the plurality of substrates;
  applying a filter to the measurement data time series and the status data time series to obtain filtered data; and
  determining, using the filtered data, a correction to be applied in an exposure step performed on a subsequent substrate.

2. A method according to clause 1, further comprising:
applying a further filter to the measurement data time series and/or the status data time series to obtain further filtered data; and
determining, using the further filtered data, a further correction to be applied in the exposure step performed on the subsequent substrate.

3. A method according to clause 1 or clause 2, wherein applying a filter and/or a further filter comprises applying a polynomial filter having terms in spatial coordinates of the substrate.

4. A method according to clause 1 or clause 2, wherein applying a filter and/or a further filter comprises transforming the measurement data time series and the status data time series into frequency space data, applying a frequency filter to the frequency space data to obtain filtered frequency space data, and transforming the filtered frequency data into the filtered data.

5. A method according to clause 1 or clause 2, wherein applying a filter and/or a further filter comprises applying a first filter to measurement data of the measurement data time series relating to a first zone of the substrates and applying a second filter, different from the first filter, to measurement data of the measurement data time series relating to a second zone of the substrates.

6. A method according to clause 5, wherein the first zone is an edge zone and the second zone is an interior zone.

7. A device manufacturing method, the method comprising:
obtaining a measurement data time series of a plurality of substrates on which an exposure step and a process step have been performed;
applying a filter to the measurement data time series to obtain filtered data;
determining, using the filtered data, a correction to be applied in an exposure step performed on a subsequent substrate;
applying a further filter to the measurement data time series to obtain further filtered data; and
determining, using the further filtered data, a further correction to be applied in the exposure step performed on the subsequent substrate.

8. A method according to clause 7, further comprising obtaining a status data time series relating to conditions prevailing when the process step was performed on at least some of the plurality of substrates, wherein applying a filter comprises applying a filter to the measurement data time series and the status data time series to obtain the filtered data.

9. A device manufacturing method, the method comprising:
obtaining a measurement data time series of a plurality of substrates on which an exposure step and a process step have been performed;
obtaining a status data time series relating to conditions prevailing when the process step was performed on at least some of the plurality of substrates;
transforming the measurement data time series and the status data time series into frequency space data;
determining, on the basis of the frequency space data, a filter to be applied to at least one of the measurement data time series and the status data time series to obtain filtered data;
applying the filter to the at least one of the measurement data time series and the status data time series to obtain filtered data; and
determining, using the filtered data, a correction to be applied in an exposure step performed on a subsequent substrate.

10. A method according to clause 9, wherein the status data time series comprises data relating to a plurality of process steps performed on the substrates and determining a filter to be applied comprises selecting a subset of the status data time series relating to a subset of the process steps to be filtered and used to determine the correction.

11. A device manufacturing method, the method comprising:
obtaining a measurement data time series of a plurality of substrates on which an exposure step and a process step have been performed;
obtaining a status data time series relating to conditions prevailing when the process step was performed on at least some of the plurality of substrates;
transforming the measurement data time series and the status data time series into frequency space data; and
determining on the basis of the frequency space data, a sampling scheme to be applied to subsequent substrates to generate a measurement data time series.

12. A method according to clause 1, wherein the correction is to be applied to correct at least one of overlay, dose and focus.

13. A method according to clause 7, wherein the correction and/or the further correction is to be applied to correct at least one of overlay, dose and focus.

14. A method according to clause 1, wherein the process step is at least one process selected from the group of: etching, annealing, implantation, deposition, and polishing.

15. A computer program comprising computer readable code means for instructing one or more lithographic tools to perform a method according to clause 1.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A device manufacturing method, the method comprising:
   obtaining a measurement data time series of a plurality of substrates on which an exposure step and a process step have been performed;
   obtaining a status data time series relating to conditions prevailing when the process step was performed on at least some of the plurality of substrates;
   applying a filter to the measurement data time series and the status data time series to obtain filtered data; and
   determining, using the filtered data, a correction to be applied in a subsequent exposure step performed on a subsequent substrate.

2. The method according to claim 1, further comprising:
   applying a further filter to the measurement data time series and/or the status data time series to obtain further filtered data; and
   determining, using the further filtered data, a further correction to be applied in the exposure step performed on the subsequent substrate.

3. The method according to claim 1, wherein applying a filter comprises applying a polynomial filter having terms in spatial coordinates of the substrate.

4. The method according to claim 1, wherein applying a filter comprises transforming the measurement data time series and the status data time series into frequency space data, applying a frequency filter to the frequency space data to obtain filtered frequency space data, and transforming the filtered frequency data into the filtered data.

5. The method according to claim 1, wherein applying a filter comprises applying a first filter to measurement data of the measurement data time series relating to a first zone of the substrates and applying a second filter, different from the first filter, to measurement data of the measurement data time series relating to a second zone of the substrates.

6. The method according to claim 5, wherein the first zone is an edge zone and the second zone is an interior zone.

7. A device manufacturing method, the method comprising:
   obtaining a measurement data time series of a plurality of substrates on which an exposure step and a process step have been performed;
   applying a filter to the measurement data time series to obtain filtered data;
   determining, using the filtered data, a correction to be applied in a subsequent exposure step performed on a subsequent substrate;
   applying a further filter to the measurement data time series to obtain further filtered data; and
   determining, using the further filtered data, a further correction to be applied in the subsequent exposure step performed on the subsequent substrate.

8. The method according to claim 7, further comprising obtaining a status data time series relating to conditions prevailing when the process step was performed on at least some of the plurality of substrates, wherein applying a filter comprises applying a filter to the measurement data time series and the status data time series to obtain the filtered data.

9. A device manufacturing method, the method comprising:
   obtaining a measurement data time series of a plurality of substrates on which an exposure step and a process step have been performed;
   obtaining a status data time series relating to conditions prevailing when the process step was performed on at least some of the plurality of substrates;
   transforming the measurement data time series and the status data time series into frequency space data;
   determining, on the basis of the frequency space data, a filter to be applied to the measurement data time series and/or the status data time series to obtain filtered data;
   applying the filter to the measurement data time series and/or status data time series to obtain filtered data; and
   determining, using the filtered data, a correction to be applied in a subsequent exposure step performed on a subsequent substrate.

10. The method according to claim 9, wherein the status data time series comprises data relating to a plurality of process steps performed on the substrates and determining a filter to be applied comprises selecting a subset of the status data time series relating to a subset of the process steps to be filtered and used to determine the correction.

11. A device manufacturing method, the method comprising:
    obtaining a measurement data time series of a plurality of substrates on which an exposure step and a process step have been performed;
    obtaining a status data time series relating to conditions prevailing when the process step was performed on at least some of the plurality of substrates;
    transforming the measurement data time series and the status data time series into frequency space data; and
    determining, on the basis of the frequency space data, a sampling scheme to be applied to subsequent substrates to generate a measurement data time series.

12. The method according to claim 1, wherein the correction is to be applied to correct at least one selected from: overlay, dose and/or focus.

13. The method according to claim 7, wherein the correction and/or the further correction is to be applied to correct at least one selected from: overlay, dose and/or focus.

14. The method according to claim 1, wherein the process step is at least one process selected from: etching, annealing, implantation, deposition, and/or polishing.

15. A non-transitory computer program product comprising a computer-readable medium having computer readable code therein, the code, when executed by a processing apparatus, configured to instruct one or more tools to at least:
    obtain a measurement data time series of a plurality of substrates on which an exposure step and a process step have been performed;
    obtain a status data time series relating to conditions prevailing when the process step was performed on at least some of the plurality of substrates;
    apply a filter to the measurement data time series and the status data time series to obtain filtered data; and
    determine, using the filtered data, a correction to be applied in a subsequent exposure step performed on a subsequent substrate.

16. A non-transitory computer program product comprising a computer-readable medium having computer readable code therein, the code, when executed by a processing apparatus, configured to instruct one or more tools to at least:
    obtain a measurement data time series of a plurality of substrates on which an exposure step and a process step have been performed;
    apply a filter to the measurement data time series to obtain filtered data;

determine, using the filtered data, a correction to be applied in a subsequent exposure step performed on a subsequent substrate;

apply a further filter to the measurement data time series to obtain further filtered data; and determine, using the further filtered data, a further correction to be applied in the exposure step performed on the subsequent substrate.

17. A non-transitory computer program product comprising a computer-readable medium having computer readable code therein, the code, when executed by a processing apparatus, configured to instruct one or more tools to at least:

obtain a measurement data time series of a plurality of substrates on which an exposure step and a process step have been performed;

obtain a status data time series relating to conditions prevailing when the process step was performed on at least some of the plurality of substrates;

transform the measurement data time series and the status data time series into frequency space data;

determine, on the basis of the frequency space data, a filter to be applied to the measurement data time series and/or the status data time series to obtain filtered data;

apply the filter to the measurement data time series and/or status data time series to obtain filtered data; and determine, using the filtered data, a correction to be applied in a subsequent exposure step performed on a subsequent substrate.

18. The method according to claim 9, wherein the correction and/or the further correction is to be applied to correct at least one selected from: overlay, dose and/or focus.

19. A non-transitory computer program product comprising a computer-readable medium having computer readable code therein, the code, when executed by a processing apparatus, configured to instruct one or more tools to at least:

obtain a measurement data time series of a plurality of substrates on which an exposure step and a process step have been performed;

obtain a status data time series relating to conditions prevailing when the process step was performed on at least some of the plurality of substrates;

transform the measurement data time series and the status data time series into frequency space data; and determine, on the basis of the frequency space data, a sampling scheme to be applied to subsequent substrates to generate a measurement data time series.

20. The method according to claim 11, wherein the process step is at least one process selected from: etching, annealing, implantation, deposition, and/or polishing.

* * * * *